United States Patent
Van Herpen et al.

(10) Patent No.: US 7,687,788 B2
(45) Date of Patent: Mar. 30, 2010

(54) DEBRIS PREVENTION SYSTEM, RADIATION SYSTEM, AND LITHOGRAPHIC APPARATUS

(75) Inventors: Maarten Marinus Johannes Wilhelmus Van Herpen, Heesch (NL); Wouter Anthon Soer, Nijmegen (NL); Kurt Gielissen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 219 days.

(21) Appl. No.: 11/826,525

(22) Filed: Jul. 16, 2007

(65) Prior Publication Data
US 2009/0021705 A1 Jan. 22, 2009

(51) Int. Cl.
*H05G 2/00* (2006.01)

(52) U.S. Cl. .............................. 250/504 R; 250/492.1; 250/492.2; 355/53; 355/67; 355/30; 378/34; 378/119

(58) Field of Classification Search .............. 250/492.1, 250/492.2, 504 R; 355/53, 67, 30; 378/34, 378/119
See application file for complete search history.

(56) References Cited

U.S. PATENT DOCUMENTS

| | | | | |
|---|---|---|---|---|
| 6,838,684 | B2 * | 1/2005 | Bakker et al. | 250/492.2 |
| 7,442,948 | B2 * | 10/2008 | Wassink | 250/504 R |
| 2002/0090054 | A1 * | 7/2002 | Sogard | 378/119 |
| 2003/0020890 | A1 * | 1/2003 | Ogushi et al. | 355/53 |
| 2004/0184014 | A1 * | 9/2004 | Bakker et al. | 355/30 |
| 2006/0033895 | A1 * | 2/2006 | Singer | 355/53 |
| 2006/0139604 | A1 * | 6/2006 | Wassink et al. | 355/67 |
| 2007/0158594 | A1 * | 7/2007 | Shirai et al. | 250/504 R |
| 2008/0067454 | A1 * | 3/2008 | Wassink | 250/504 R |

\* cited by examiner

*Primary Examiner*—David A Vanore
*Assistant Examiner*—Michael Maskell
(74) *Attorney, Agent, or Firm*—Pillsbury Winthrop Shaw Pittman LLP

(57) ABSTRACT

A debris prevention system is constructed and arranged to prevent debris that emanates from a radiation source from propagating with radiation from the radiation source into or within a lithographic apparatus. The debris prevention system includes an aperture that defines a maximum emission angle of the radiation coming from the radiation source, and a first debris barrier having a radiation transmittance. The first debris barrier includes a rotatable foil trap. The debris prevention system also includes a second debris barrier that has a radiation transmittance. The first debris barrier is configured to cover a part of the emission angle and the second debris barrier is configured to cover another part of the emission angle.

25 Claims, 9 Drawing Sheets

DEBRIS PREVENTION SYSTEM, RADIATION SYSTEM, AND LITHOGRAPHIC APPARATUS

FIELD

The present invention generally relates to a debris prevention system, radiation system and lithographic apparatus comprising the same. More specifically, the invention relates to a debris prevention system constructed and arranged to prevent debris emanating from a radiation source from propagating with radiation from the radiation source into or within a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In addition to EUV radiation, radiation sources used in EUV lithography generate contaminant material that may be harmful for the optics and the working environment in which the lithographic process is carried out. Hence, in EUV lithography, a desire exists to limit the contamination of the optical system that is arranged to condition the beams of radiation coming from an EUV source. To this end, it is known to use a so-called rotating foil trap (RFT), for instance, as disclosed in U.S. Pat. No. 6,838,684. A foil trap uses a high number of closely packed foils that may be aligned generally parallel to the direction of the radiation generated by the EUV source. Contaminant debris, such as micro-particles, nano-particles and ions can be trapped in walls provided by foil plates. Thus, the foil trap functions as a contamination barrier trapping contaminant material from the source. However, heat load due to the radiation source imposes a significant challenge to the rotating construction of the prior art embodiments, in particular, in view of a difficulty of cooling the rotating part.

SUMMARY

It is desirable to reduce the heat load on the rotating foil trap. According to an embodiment of the invention, there is provided a debris prevention system constructed and arranged to prevent debris that emanates from a radiation source from propagating with radiation from the radiation source into or within a lithographic apparatus. The debris prevention system includes an aperture that defines a maximum emission angle of the radiation coming from the radiation source, and a first debris barrier having a radiation transmittance. The first debris barrier includes a rotatable foil trap. The debris prevention system also includes a second debris barrier having a radiation transmittance. The first debris barrier is configured to cover a part of the emission angle and the second debris barrier is configured to cover another part of the emission angle.

According to an embodiment of the invention, there is provided a radiation system that includes a radiation source that includes a plasma produced discharge source configured to generate extreme ultraviolet radiation. The discharge source includes a pair of electrodes configured to be provided with a voltage difference, and a discharge system constructed and arranged to produce a discharge between said pair of electrodes so as to provide a pinched plasma in a central area between said electrodes. The radiation system also includes a debris prevention system constructed and arranged to prevent debris that emanates from the radiation source from propagating with radiation from the radiation source into or within a lithographic apparatus. The debris prevention system includes an aperture that defines a maximum emission angle of the radiation coming from the radiation source, and a first debris barrier having a radiation transmittance. The first debris barrier includes a rotatable foil trap. The debris prevention system also includes a second debris barrier having a radiation transmittance. The first debris barrier is configured to cover a part of said emission angle and the second debris barrier is configured to cover another part of the emission angle.

According to an embodiment of the invention, there is provided a radiation system that includes a radiation source, and a debris prevention system constructed and arranged to prevent debris that emanates from the radiation source from propagating with radiation from the radiation source into or within a lithographic apparatus. The debris prevention system includes an aperture that defines a maximum emission angle of the radiation coming from the radiation source, and a first debris barrier having a radiation transmittance. The first debris barrier includes a rotatable foil trap. The debris prevention system further includes a second debris barrier having a radiation transmittance. The first debris barrier covers a part of the emission angle and the second debris barrier covers another part of the emission angle. The radiation system also includes a collector that defines a collection angle over which light is collected. The rotatable foil trap and the second debris barrier are arranged to mitigate debris substantially over the entire collection angle.

According to an embodiment of the invention, there is provided a lithographic apparatus that includes an illumination system configured to condition a radiation beam, and a support constructed to support a patterning device. The patterning device is configured to impart the radiation beam with a pattern in its cross-section to form a patterned radiation beam. The apparatus also includes a substrate table constructed to hold a substrate, a projection system configured to project the patterned radiation beam onto a target portion of the substrate, and a debris prevention system constructed and arranged to prevent debris that emanates from a radiation source from propagating with radiation from the radiation source into or within the lithographic apparatus. The debris prevention system includes an aperture that defines a maximum emission angle of the radiation coming from the radiation source; a first debris barrier having a radiation transmittance. The first debris barrier includes a rotatable foil trap. The debris prevention system also includes a second debris barrier having a radiation transmittance. The first debris barrier is configured to cover a part of said emission angle and the second debris barrier is configured to cover another part of the emission angle.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
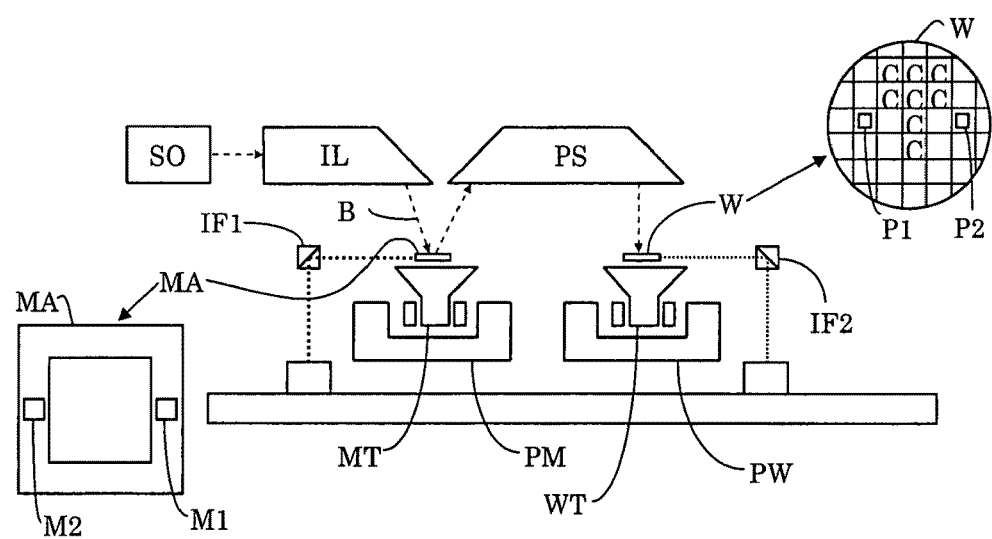
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if desired, may be referred to as a radiation system.

The illuminator IL may comprise an adjuster for adjusting the angular intensity distribution of the radiation beam. Generally, at least the outer and/or inner radial extent (commonly referred to as δ-outer and δ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following, modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
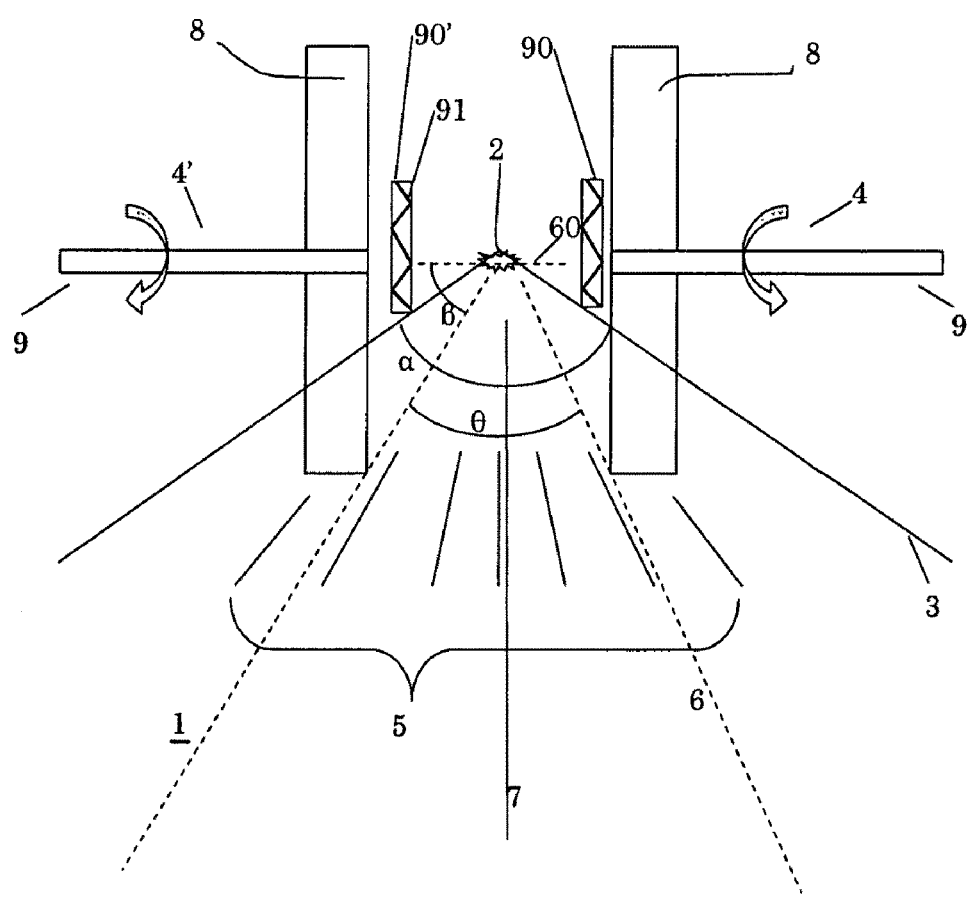
FIG. 2 shows a system that generates a beam of radiation according to an embodiment of the invention.

FIG. 2 shows an embodiment of a radiation system 1 that is constructed and arranged to generate a beam of radiation. The radiation system 1 comprises a debris generating radiation source 2. Through dimensioning of the system and the surrounding housing, an aperture 3 is provided. The aperture 3 is schematically illustrated by aperture defining shields 90, 90'. The shields may comprise coolant circuits 91. The aperture 3 defines an emission angle α, which is a maximum angle that EUV-radiation coming from source 2 is to be collected. In the illustrated embodiment, two rotatable foil traps (RFT's) 4 and 4' are provided to cover a part of said emission angle α. The shields 90, 90' may block EUV radiation to the entire area of the foil traps 4, 4' that are outside the emission angle α. Another debris barrier 5 is provided in central part of the emission angle α, and covers opening angle θ, as will be explained in further detail below. The debris barrier may be transmittant to EUV radiation by at least 20%.

The embodiment reminds of a Mississippi boat type of configuration with two rotating foil traps 4, 4' arranged on opposite sides of the central debris barrier 5. In this embodiment, the central debris barrier 5 is a position sensitive foil trap further explained with reference to FIG. 8. The emission angle α defines a cone of (to be collected) EUV-light 6 originating from a source 2. The source may be a discharge produced EUV-source, such as a 2-type source, known in the art. As can be seen from FIG. 2, the EUV-light 6 emitted at larger angles relative to an optical axis 7 that divides the emission angle α travels through the rotated foil traps 4 and 4' (angle>θ) and a light emitted in angles<θ around the optical axis travels through the position sensitive foil trap 5. The foil traps 4, 4' can be of a kind having a rotatable shaft 9 mounted radially with respect to the source 2. Each shaft 9 may be oriented relative to source 2 to align with a line 60 traveling through the radiation source 2. A plurality of the foils 8 are mounted radially with respect to the shaft 9, that is, having the shaft 9 as the center, the foils 8 will be oriented in the radial directions relative to that center. In this way, the foil trap 4 may provide a barrier against debris from source 2 by rotating the foils so as to catch debris traveling from the source 2. Although FIG. 2 shows the shafts 9 of foil traps 4, 4' to coalign in substantially the same plane, other arrangements are possible, such as the arrangement shown in FIG. 4. In particular, relative positions of the foil traps 4 and 4' and the position sensitive foil trap 5 can be optimized independently. For example, the foil traps 4, 4' may be placed further away from the source 2 to make more space available for the source 2. In an embodiment, the arrangement of rotatable foil traps 4, 4' relative to the static foil trap 5 may be such that the foil traps 4, 4' are partly inserted into the static foil trap 5. In such an embodiment, the chance that debris will be emitted by centrifugal forces from the rotated foil traps 4, 4' may be substantially reduced or even prevented by catching the debris with the static foil trap 5.

FIG. 2 shows that platelets of static foil trap 5 partly extend in front of the rotatable foil traps 4, 4', seen in a viewing direction along optical axis 7 towards the source 2, so that debris that is emitted from the foil trap 4 may be caught by static foil trap 5. Instead of the static foil trap 5, other debris catching mechanisms may be used. As can been seen in FIG. 2, in order to minimize the heat load on rotatable foil traps 4, 4', only a part of the plurality of foils 8 is exposed per instant to radiation from the source 2 and the other parts are not exposed. The shafts 9 of the rotatable foil trap 4, 4' should not be exposed to radiation from the source 2. Thus, the foil traps 4, 4' may be placed at least partly outside emission angle $\alpha$. Accordingly, the rotating foil trap 4, 4' will rotate foils 8 into and out of the aperture 3. The arrangement of FIG. 2 is symmetric with respect to the emitted angle $\alpha$ but other arrangements are possible, including non-symmetric arrangements. For example, a plurality of rotatable foil traps 4, 4', each comprising a shaft 9 mounted radially with the source 2, can be provided and each having a plurality of foils 8 mounted radially to the shafts 9 for providing a barrier against debris from source 2.

Figure 3:
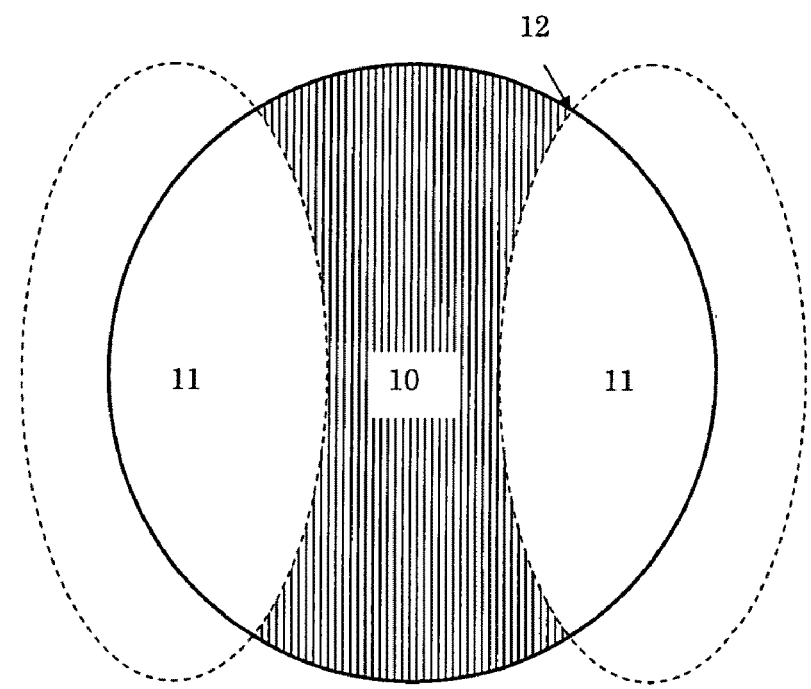
FIG. 3 shows a projection of a collected solid angle of the embodiment of FIG. 1, as seen along the optical axis.

FIG. 3 shows a schematic view of a projection of a collected solid angle of the embodiment of FIG. 2, seen along an optical axis 7 (not shown, see FIG. 2). In particular, a central zone 10 is covered by a position sensitive foil trap 5 and peripheral areas 11 are covered by the rotating foil traps 4, 4'. The radius of a single rotating foil trap 4 and its distance to the source 2 determine the opening angle $\beta$ for that single foil trap 4 (see FIG. 2). This opening angle has a minimum value that is determined by the total angle $\alpha$ to be collected and the (horizontal) opening angle $\theta$ of the position sensitive foil trap 5. Consider one of the outer corners of the position sensitive foil trap 5, indicated by point 12 in FIG. 3. Since this point is on the edge of the collected cone $\alpha$, we have $$\cos \alpha = \cos \theta \cos \phi \quad (1)$$

where $\phi$ is the elevation angle above the horizontal plane through the optical axis. Furthermore, since it must also be within the cone $\beta$ protected by the rotatable foil trap, we have $$\cos \beta = \sin \theta \cos \phi \quad (2)$$

Combining (1) and (2) gives the following relation between the opening angle $\beta$ of the rotatable foil trap and the opening angle $\theta$ of the position sensitive foil trap (PSFT) for a given collection angle $\alpha$:

$$\cos \beta = \tan \theta \cos \alpha \quad (3)$$

Figure 4:
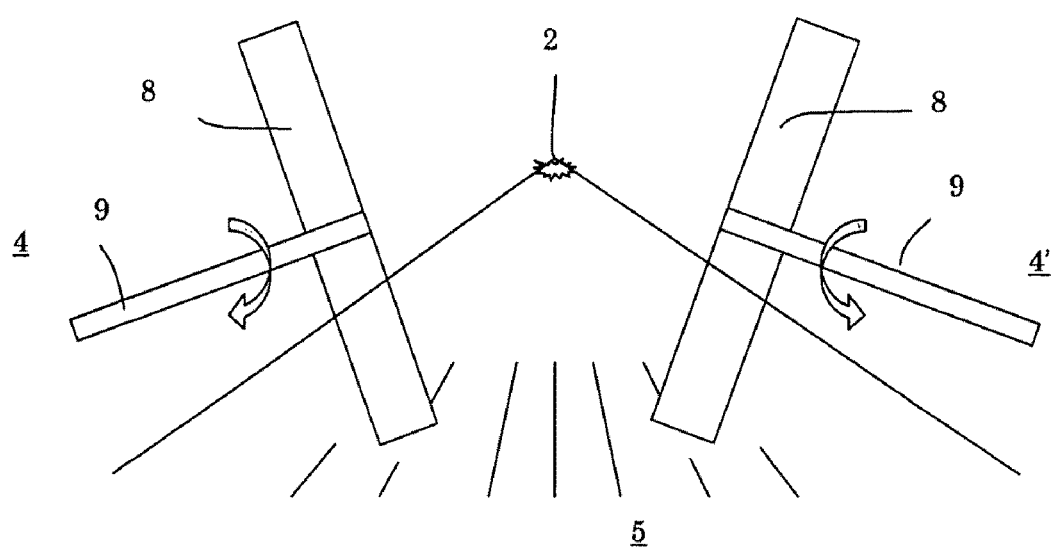
FIG. 4 shows a modification of the embodiment of FIG. 2.

FIG. 4 shows a modification of the embodiment shown in FIG. 2. In particular, the shafts 9 of rotatable foil traps 4, 4' are provided in a single plane, but the shafts form an angle with respect to each other. The angle depends on the angle $\alpha$ and is preferably around 5-10 degrees larger, depending on the size of the shaft 9, such that the shaft stays out of the angle $\alpha$. Typical values for the angle between the shafts are larger than 100 degrees, and more preferably larger than about 120, about 140, about 160 or about 180 degrees. This embodiment may allow the radius of the foil traps 4, 4' to be smaller since a larger part of the rotating foil trap 4 is used. This can be deduced by replacing $\theta$ by $\theta+\delta$ in equation (2), where $\delta$ is the angle over which the rotating foil traps 4, 4' have been moved inwards. In addition, more space becomes available for the EUV source 2. For example, there is more room for the electrodes and circuitry needed to provide the pinch. In addition, it is also possible to move the rotating foil traps 4, 4' in the other direction. This will further reduce the heat load, but will increase an opening angle $\beta$ for the rotating foils traps 4, 4', which may make them to be larger. By tilting the rotating foil traps inwards, i.e. towards to optical axis it is preferable to maintain the shafts just outside emission angle in order to maintain a high optical transmittance and a relatively low heat load on the rotating foil trap 4. The rotating foil traps 4, 4', for example, are positioned such that the angle between shafts 9 and optical axis is 85° instead of 90° when the maximum collection angle is 80°. Due to a tilt of the angles, more design space may be available for the source 2.

Figure 5:
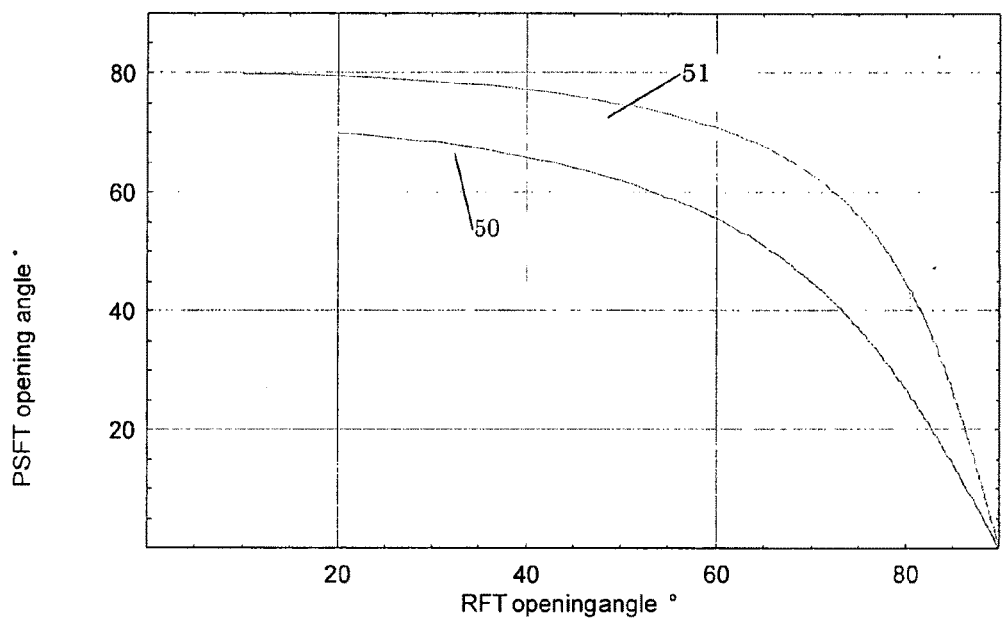
FIG. 5 shows a relation between the horizontal opening angle of a static foil trap and an opening angle of a rotating foil trap.

FIG. 5 shows a relation between the required horizontal opening angle $\theta$ of a static foil trap 5 and an opening angle $\beta$ of a rotating foil trap, in particular depicted in FIGS. 2 and 3. A typical collection angle is 80°. Assuming that the opening angle of the rotating foil traps 4 is 80°, in equations (1) to (3) above, $\tan \theta = 1$ and therefore the horizontal opening angle $\theta$ of the static foil trap 5 is equal to 45°. FIG. 5 shows a plot of equation (3) showing the relation between the horizontal opening angle $\theta$ of a static foil trap 5 and an opening angle $\beta$ of the rotating foil traps 4 for a total collection angle of 70° (line 50) and 80° (line 51). The collection angle equals the emission angle and will be in order of about 60 to about 90°, and preferably at least about 70°.

Figure 6:
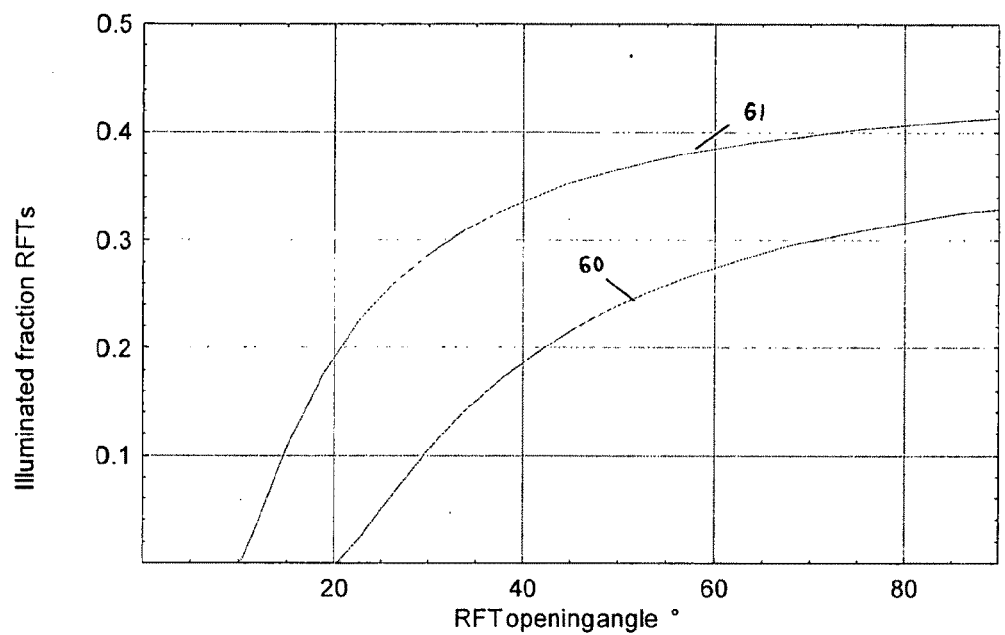
FIG. 6 shows an illuminated solid angle fraction of a rotating foil trap, as a function of an opening angle of the rotating foil trap.

FIG. 6 shows the fraction of the rotating foil traps that is within the collection angle, which is about 25-40% (i.e. about 25-40% of each rotating foil trap is illuminated at a time), depending on the collection angle ranging between 70° (line 60) and 80° (line 61). This means that the rotating foil traps 4, 4' receive a substantially lower heat load than a conventional rotating foil trap with the same geometry, which may improve performance since the heat load may be limiting for the performance of the rotating foil traps. Furthermore, the area of the rotating foil trap outside the collection angle can be used for additional cooling.

Figure 7:
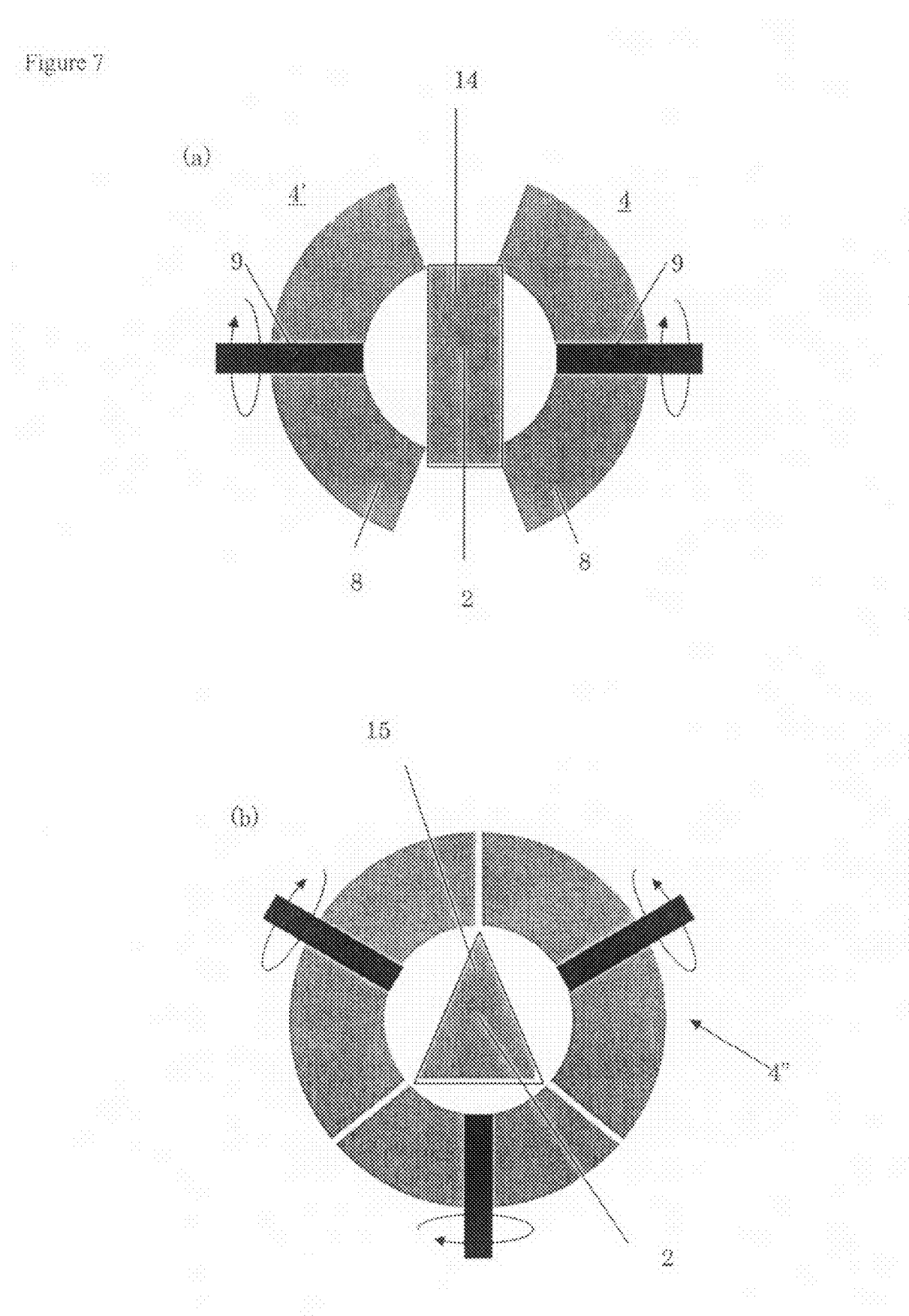
FIGS. 7a and 7b each show a system that generates a beam of radiation according to an embodiment of the invention.

FIG. 7a and 7b show embodiments according to the invention. These embodiments do not use a central debris barrier in the form of a static foil trap. The central area can be reduced by providing cup shaped foils 8 extending distally relative to their respective shafts 9. Such an arrangement may leave a small gap 14 between the foils 8 of the opposed rotating foil traps 4, 4'. In the embodiment shown in FIG. 7a, two foil traps 4, 4' are placed around the radiation source 2. The shafts 9, and therefore rotation axes, of the rotation foil traps 4, 4' are aligned with the radiation source and are substantially perpendicular to the optical axis. The central part that is not covered by the rotating foil traps can be closed off by, for example, a shield. Due to the fact that most EUV-collectors (not shown) have a minimum collection angle of about 10°, additional EUV loss due to absence of transmittance in the central area 14 may be relatively small. In other embodiments, the collection angles covered by two rotatable foil traps (RFTs) may overlap. This may be achieved in two ways. First, by letting the foils of the RFTs intertwine without touching each other. This requires synchronization of the RFTs that may be difficult at the high rotation frequencies at hand. Second, by placing the RFTs behind one another. The RFT that is furthest from the source has long foils in order to obtain a substantial opening angle, which may increase the mechanical stress in the foils due to the centrifugal forces and may thereby limit the attainable rotation frequency.

Table 1 shows a typical set of parameters for an arrangement of FIG. 7a.

TABLE 1

Parameters used in transmission calculation.

Source and collection parameters

| | |
|---|---|
| Minimum collection angle | 10° |
| Maximum collection angle | 80° |
| Pinch length | 0.3 mm |
| Pinch diameter | 0.1 mm |

RFT parameters

| | |
|---|---|
| Inner radius | 30 mm |
| Outer radius | 70 mm |
| Number of foils | 100 |
| Foil thickness | 0.15 mm |

Although in principle the opening angle of the embodiments in FIG. 7a and 7b can be very large, some practical limitations may include mechanical deformation of the foils, and the space requirements of the source, which may prevent the foils 8 from becoming too large. These aspects may give rise to a maximum opening angle of 70°, at which the transmission ratio is around 60%. The areas that do not contribute to transmission may be closed off.

FIG. 7b shows an embodiment according to the invention. In this embodiment, three rotating foil traps are shown, each having their shafts oriented radially with respect to the source 2. Also, the foil traps 4" may be shaped in a cup shaped form with a triangular configuration. For example, the shafts 9 of the foil traps 4 form angles of 120° relative to each other so that a contiguous closure of the source 2 can be provided. In effect, a central triangular area 15 is left that is not covered by the foil traps 4. This area can be protected by other debris mitigation systems or can be completely sealed off. A calculated transmittance of this configuration is around 62% of the total emission angle. In addition, multiple rotating foil traps such as four equally sized rotating foil traps can be placed having rotation axis perpendicular to the optical axis at mutual angles of 90°. The maximum opening angle that can be maintained in this case is about 45° and a calculated overall transmittance is about 42%. The size of the unprotected gap in embodiments FIGS. 7a and 7b can be reduced in specific cases by increasing the opening angle of two rotating foil traps at the expense of the third (and/or fourth) rotating foil trap. For example, one may have a configuration with two rotating foil trap of 70° and one rotating foil trap of 40° opening angle. A good optical transmission may be achieved at a significantly lower rotating foil trap-opening angle than the conventional rotating foil trap. Moreover, the heat load may be substantially smaller as mentioned before. As a result, the embodiments of FIGS. 7a and 7b can be scaled to much higher power levels than the conventional rotating foil trap. In the embodiments of FIGS. 7a and 7b, the shafts can be tilted towards the optical axis in order to further reduce the central area. Table 2 summarizes the transmittance values of all embodiments mentioned above. In each case, the opening angle of the rotating foil traps is chosen so as to give maximum transmittance, with the constraint of a 70° maximum rotating foil trap-opening angle (i.e. it is assumed that this is the maximum rotating foil trap-opening angle that can be achieved under production tool conditions). In order to stop atomic debris, the rotating foil trap is usually combined with a stationary foil trap (SFT) of typically 80% transmittance. The transmittance values of this combination are also included in Table 2 in order to reflect the typical transmittance of the entire debris mitigation tool.

TABLE 2

Comparison of transmittance values without and with a stationary foil trap (SFT) of 80% transmittance.

| | 10-80° collector | |
|---|---|---|
| Foil trap type | without SFT | with SFT |
| Preferred embodiment: 3 RFTs tilted | 70.4% | 56.4% |
| 3 RFTs | 64.6% | 51.7% |
| 4 RFTs | 58.6% | 46.9% |
| 2 RFTs | 56.6% | 45.3% |

Accordingly, embodiments can be provided having two, three or four foil traps preferably arranged symmetrically with the respect to the plain of symmetry parallel to an optical axis. In particular the rotation axis of the rotatable foil traps forms at least an angle of 70° with respect to the optical axis.

Figure 8:
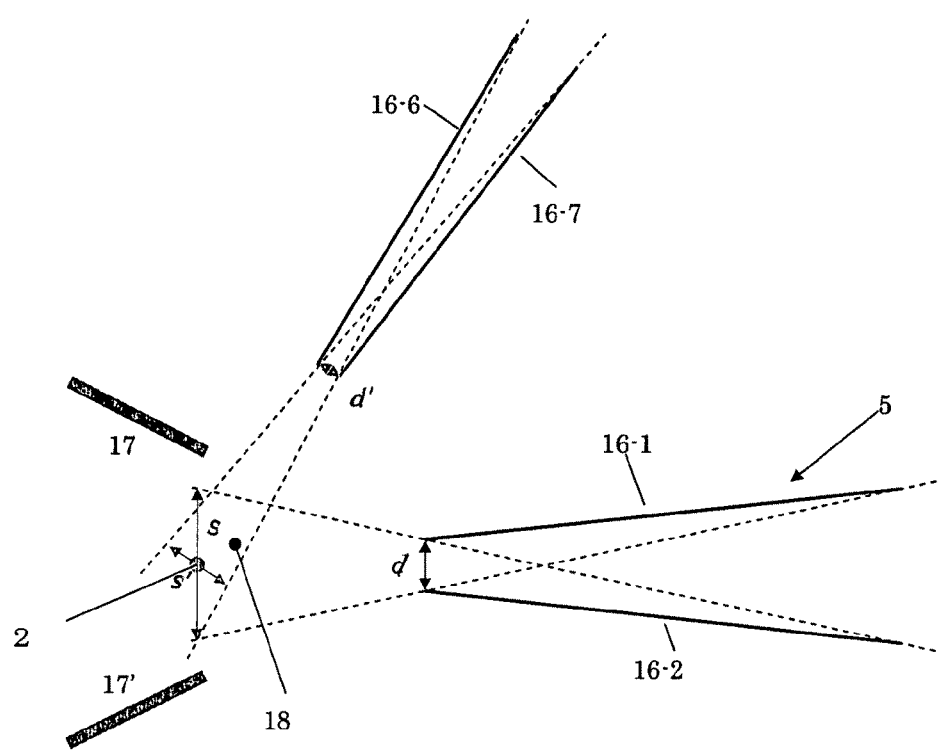
FIG. 8 shows a detailed schematic view of an embodiment of a static foil trap.

FIG. 8 shows a detailed schematic view of a static foil trap 5, as shown in FIG. 2. In this configuration, platelets, or foils, 16 are static and oriented to shield electrodes 17 for a line of sight provided between the platelets 16 and to provide a passage for radiation from the central volume 18 formed between electrodes 17. In particular, the source 2 is a plasma produced discharge source for generating extreme ultraviolet radiation. The pair of electrodes 17 is provided with a voltage difference by a corresponding circuit, (not shown) which circuit functions to produce a discharge between the electrodes 17 for providing a pinched plasma (Z-Pinch) in a central volume 18 between the electrodes 17. Due to the stationary character of the position sensitive foil trap 5, the heat load can be relatively high since this type of debris barrier can be cooled effectively by appropriate cooling (not shown) and because it experiences no mechanical stress due to rotation. The foils 16 of a position sensitive foil trap 5 are all directed towards the source 2 (e.g., pinch); the spacing between the foils 16 determines how much of the volume 18 surrounding the pinch is transmitted through the foil trap 5. In order for the foil trap 5 to be able to separate the pinch from the electrodes, many closely packed foils 16 are used. This is illustrated in FIG. 8, showing two neighboring foils 16-1, 16-2 in the central part of the foil trap, aligned with the pinch 2 between electrodes 17, 17'. The filter distance s is defined as the width of the area that is transmitted through the foil trap and forms a central volume 18. It is related to the foil trap dimensions by $$\tan\theta = \frac{d_1 + d_2}{2(r_2 - r_1)} = \frac{d_2 + s}{2r_2} \qquad (4)$$

Since by definition $d_2 = (r_2/r_1) d_1$, this can be rewritten as $$s = \frac{2r_2}{r_2 - r_1} d_1 \qquad (5)$$

For example, the foil trap geometry may be such that the inner radius $r_1 = 30$ mm, the outer radius $r_2 = 90$ mm and the foil spacing at the entrance of the foil trap $d_1 = 0.5$ mm, in which case the filter distance s=1.5 mm. Thus, with a typical electrode gap of 3 mm, the electrodes are not visible through the foil trap.

The positionally selective foil trap shown in FIG. 8 is an example of a debris barrier that has a transmittance for EUV radiation. Typical transmittance values are 60% or even higher, 80-90%. However at large angles from the optical axis as shown in FIG. 8 the spacing becomes very small which may affect the transmittance. If the foils 16-6 and 16-7 are to transmit the same distance s, as measured perpendicular to the optical axis, the projected filter distance s' is much smaller than s; specifically, $s'=s \cos \theta$, where $\theta$ is the angle from the optical axis.

For example, a typical collector-opening angle of 140° requires debris mitigation at an angle of 70° from the optical axis. With the abovementioned foil trap geometry, this leads to a foil spacing of only 0.17 mm for the outer foils (as compared to 0.5 mm for the inner foils). Consequently, the optical transmission of the outer foils is very low (~40% assuming a foil thickness of 0.1 mm). Additionally, due to the close spacing, Sn contamination quickly fills the spaces between the foils of the foil trap so that the transmission is further reduced. Thus, the foil trap works best at small angles $\theta$ may be used as central foil trap 5 in the embodiments described herein.

Figure 9:
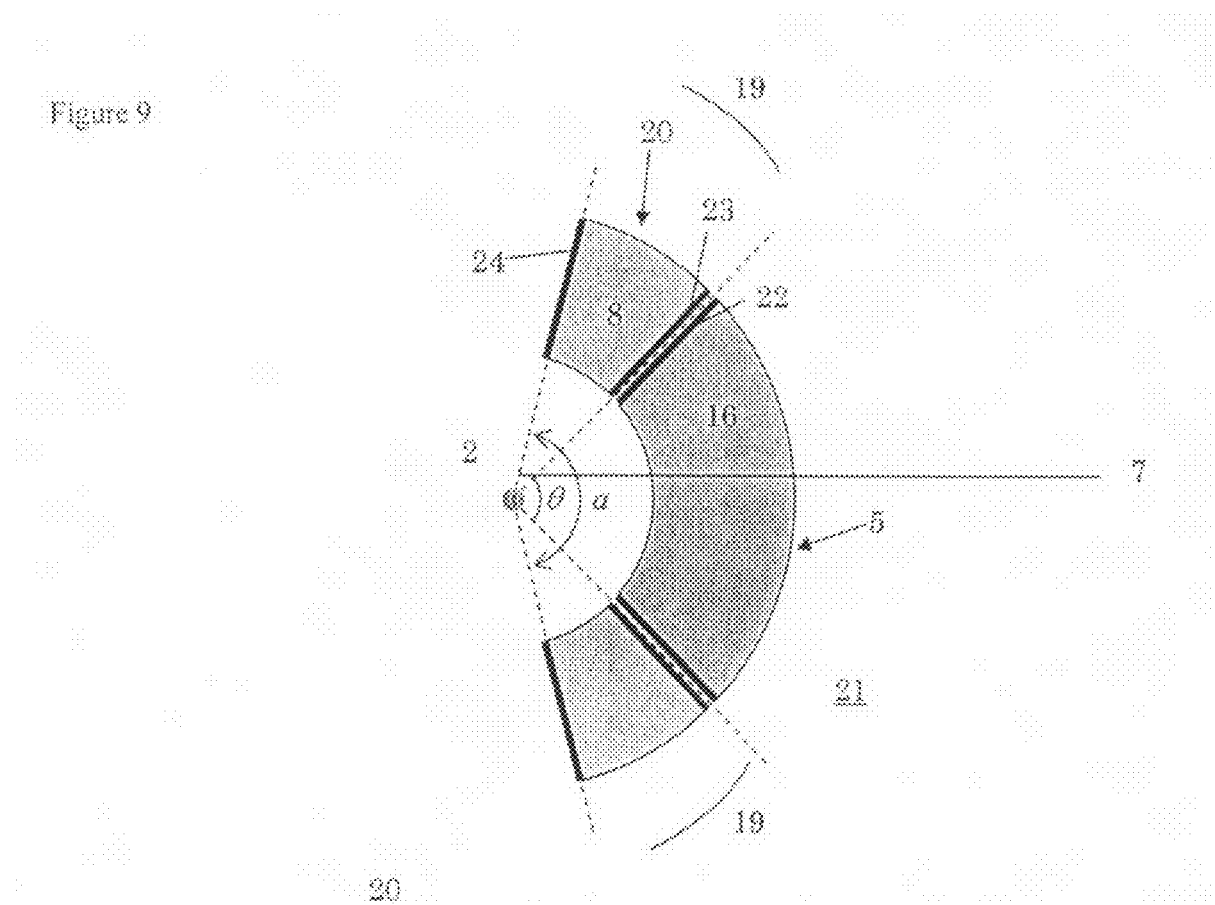
FIG. 9 shows a schematic top view of an embodiment of a static foil trap.
Figure 10:
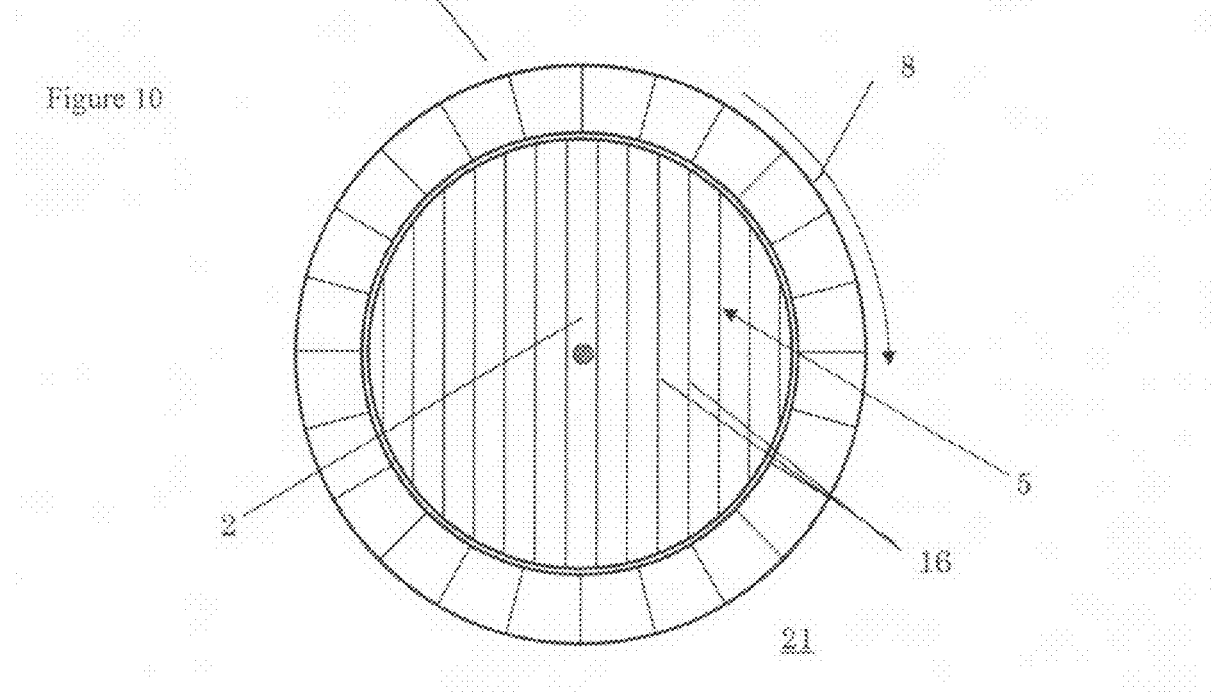
FIG. 10 shows a schematic front view of the embodiment of FIG. 9.

FIG. 9 shows a schematic top view of embodiment that provides increased transmittance for the peripheral zones 19 of the static foil trap 5. FIG. 10 shows a schematic front view of the embodiment of FIG. 9. A combined foil trap structure is provided that includes a position sensitive foil trap 5 for mitigation at small angles from the optical axis dividing angle $\theta$ and a rotating foil trap 20 for mitigation at large angles>$\theta$ from the optical axis 7. Accordingly, a rotatable foil trap 20 is arranged to rotate around the static configuration of platelets 16. The combined foil trap 21 has a better optical transmission than a static foil trap 5 and can sustain a higher heat load than a rotating foil. In particular, the static continuation of platelets 16 is arranged symmetrically with respect to the optical axis (not shown). In the embodiment illustrated by FIG. 9, debris is stopped within a solid angle $\theta$ around optical axis by position sensitive foil trap 5 having foils 16 suspended in a casing 22 and directed to a source pinch 2. Typical values of $\theta$ lie between 60° and 120°. The remainder of the solid imaging angle $\alpha$ in which EUV is collected (in size is corresponding to an opening angle of a collector) is covered by a foil trap 20 that rotates around the static foil trap 5. The rotating foil trap 20 comprises foils 8 that are suspended between an inner ring 23 and an outer ring 24.

Although the foils 16 of the position sensitive foil trap 5 and the foils 8 of the rotating foil trap 20 are shown in FIG. 9 as having the same length and distance to the pinch, it is noted here that this is not necessary. In fact, the foil length and distance to the pinch may be optimized independently for both foil traps.

The rotating foil trap may be driven on either the inner ring 23 or the outer ring 24. Driving the foil trap on the outer ring 24 allows the rotation mechanism to be placed outside the EUV collection angle, which improves the optical transmission of the foil trap system 4. In addition to the foils 8, spokes may be mounted between the inner ring 23 and the outer ring 24 to provide the necessary rigidity of the rotating foil trap 20.

The casing 22, inner ring 23 and outer ring 24 may be used for cooling of the foil trap structure 21. Furthermore, the gaps between the casing 22 and inner ring 23 may be furnished with bearings. In an embodiment, this gap is filled with liquid metal, e.g. a Ga—In—Sn alloy, which acts both as a bearing and a coolant. The foil trap 21 according to this embodiment can sustain a much higher heat load than a conventional rotating foil trap covering the entire collection angle $\alpha$, because of the short length of the foils, the enhanced possibilities for cooling and the robust design with an inner ring 23 and outer ring 24 connected by spokes (not shown). In an embodiment, the combined foil trap 21 may be used to suppress not only microparticle debris but also atomic and ionic debris. In an embodiment, buffer gas may be injected between the foils of the position sensitive foil trap and the rotating foil trap. In an embodiment, a conventional stationary foil trap may be placed behind the rotating foil trap and the buffer gas may be injected between the foils of the position sensitive foil trap and the stationary foil trap.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although in the embodiments described above, the source 2 is a discharge produced source, other debris generating sources can be used, such as a laser induced plasma source. Furthermore, although debris is generally referenced as Tin-debris, other debris generating sources using other plasma materials can be used in accordance with embodiments of the invention, such as Lithium or Xenon-sources. In addition, the radiation systems that are described are manufactured generally independently from the lithographic apparatus and may include other subsystems, such as a collector, that collect radiation from the radiation system. These collectors can be of any suitable kind, such as of a kind that defines a collection angle, and the debris barriers, such as the rotatable foil traps 4 and static foil traps 5, may be arranged to mitigate debris over the entire collection angle of the collector. For example, the collector element can be cylinder symmetric and comprise concentrically curved reflective surfaces. These surfaces may be generally stacked at a distance ranging substantially from about 2 cm to about 7 cm.

In accordance with embodiments described herein, the debris prevention system may be used with or as part of a radiation system and with or as part of a lithographic apparatus, such as the lithographic apparatus of FIG. 1 arranged with a source SO as specified in the previous embodiments.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A debris prevention system constructed and arranged to prevent debris that emanates from a radiation source from propagating with radiation from the radiation source into or within a lithographic apparatus, the debris prevention system comprising:
    an aperture that defines a maximum emission angle of the radiation coming from the radiation source;
    a first debris barrier having a radiation transmittance, the first debris barrier comprising a rotatable foil trap; and
    a second debris barrier having a radiation transmittance, wherein said first debris barrier is configured to cover a part of said emission angle and said second debris barrier is configured to cover another part of said emission angle, and
    wherein the rotatable foil trap comprises a shaft mounted radially with respect to the radiation source, and a plurality of foils mounted radially with respect to said shaft that provide a barrier against said debris.

2. A debris prevention system according to claim 1, wherein said shaft is placed at least partly outside said emission angle.

3. A debris prevention system according to claim 1, wherein said rotatable foil trap is arranged to rotate said foils into and out of said emission angle.

4. A debris prevention system according to claim 1, wherein said second debris barrier comprises a further rotatable foil trap.

5. A debris prevention system according to claim 4, wherein said further rotatable foil trap comprises a shaft mounted radially with respect to the source, and a plurality of foils mounted radially to said shaft that provide a barrier against said debris.

6. A debris prevention system according to claim 5, wherein said rotatable foil traps each have their shafts provided lying in a single plane.

7. A debris prevention system according to claim 5, wherein said rotatable foil traps are arranged to have their respective shafts forming an angle larger than 140°.

8. A debris prevention system according to claim 5, wherein said foil traps are formed by oppositely arranged cup-shaped foils extending distally relative to their respective shafts.

9. A debris prevention system according to claim 4, wherein two, three or four foil traps are arranged symmetrically with respect to a plane of symmetry parallel to an optical axis.

10. A debris prevention system according to claim 9, wherein the rotation axes of the rotatable foil traps form an angle of at least 70° with respect to the optical axis.

11. A debris prevention system according to claim 1, wherein said emission angle is at least 70°.

12. A debris prevention system according to claim 1, wherein said aperture is defined by shields provided between the source and the rotatable foil trap.

13. A debris prevention system according to claim 12, wherein said shields comprise cooling circuits.

14. A radiation system comprising:
    a radiation source comprising a plasma produced discharge source configured to generate extreme ultraviolet radiation, the discharge source comprising a pair of electrodes configured to be provided with a voltage difference, and a discharge system constructed and arranged to produce a discharge between said pair of electrodes so as to provide a pinched plasma in a central area between said electrodes; and
    a debris prevention system constructed and arranged to prevent debris that emanates from the radiation source from propagating with radiation from the radiation source into or within a lithographic apparatus, the debris prevention system comprising
        an aperture that defines a maximum emission angle of the radiation coming from the radiation source;
        a first debris barrier having a radiation transmittance, the first debris barrier comprising a rotatable foil trap; and
        a second debris barrier having a radiation transmittance, wherein said first debris barrier is configured to cover a part of said emission angle and said second debris barrier is configured to cover another part of said emission angle,
    wherein said second debris barrier comprises a static configuration of platelets, and
    wherein the platelets are oriented to shield the electrodes from a line of sight provided between said platelets and to provide passage to radiation from the central area.

15. A radiation system according to claim 14, wherein said rotatable foil trap is arranged to rotate around said static configuration of platelets.

16. A radiation system according to claim 14, wherein said static configuration of platelets is arranged centrally with respect to an optical axis; and wherein a plurality of rotatable foil traps are arranged peripherally respective to said platelets.

17. A radiation system according to claim 16, wherein two, three or four foil traps are arranged peripherally.

18. A radiation system according to claim 17, wherein said foil traps are arranged partly inserted into said static configuration of platelets for capturing debris that is re-emitted by the rotating foil trap.

19. A radiation system comprising:
    a radiation source;
    a debris prevention system constructed and arranged to prevent debris that emanates from the radiation source from propagating with radiation from the radiation source into or within a lithographic apparatus, the debris prevention system comprising an aperture that defines a maximum emission angle of the radiation coming from the radiation source;

a first debris barrier having a radiation transmittance, the first debris barrier comprising a rotatable foil trap; and a second debris barrier having a radiation transmittance, wherein the first debris barrier covers a part of said emission angle and said second debris barrier covers another part of said emission angle; and a collector that defines a collection angle over which light is collected, wherein said rotatable foil trap and said second debris barrier are arranged to mitigate debris substantially over the entire collection angle, wherein the second debris barrier comprises a static configuration of platelets, and wherein the rotatable foil trap is configured to rotate relative to the second debris barrier.

20. A radiation system according to claim 19, wherein said collector element is cylindrically symmetric and comprises concentrically curved reflective surfaces.

21. A radiation system according to claim 20, wherein said reflective surfaces are stacked at a distance ranging between about 2 cm and about 7 cm.

22. A radiation system according to claim 19, wherein said collector element is of a normal incidence type.

23. A radiation system according to claim 19, wherein said radiation source comprises a discharge produced or a laser induced plasma source.

24. A radiation system according to claim 23, wherein said plasma source comprises Tin or Lithium or Xenon.

25. A lithographic apparatus comprising:

an illumination system configured to condition a radiation beam;

a support constructed to support a patterning device, the patterning device being configured to impart the radiation beam with a pattern in its cross-section to form a patterned radiation beam;

a substrate table constructed to hold a substrate;

a projection system configured to project the patterned radiation beam onto a target portion of the substrate; and a debris prevention system constructed and arranged to prevent debris that emanates from a radiation source from propagating with radiation from the radiation source into or within the lithographic apparatus, said debris prevention system comprising an aperture that defines a maximum emission angle of the radiation coming from the radiation source;

a first debris barrier having a radiation transmittance, the first debris barrier comprising a rotatable foil trap; and a second debris barrier having a radiation transmittance, wherein said first debris barrier is configured to cover a part of said emission angle and said second debris barrier is configured to cover another part of said emission angle, and wherein the rotatable foil trap comprises a shaft mounted radially with respect to the radiation source, and a plurality of foils mounted radially with respect to said shaft that provide a barrier against said debris.

* * * * *